United States Patent
Fuller et al.

(10) Patent No.: US 10,204,762 B2
(45) Date of Patent: Feb. 12, 2019

(54) ENDPOINTING FOR FOCUSED ION BEAM PROCESSING

(75) Inventors: Scott Edward Fuller, Portland, OR (US); Jason Donald, Portland, OR (US); Termsupt Seemuntchaiboworn, Bangkok (TH)

(73) Assignee: FEI Company, Hillsboro, OR (US)

( * ) Notice: Subject to any disclaimer, the term of this patent is extended or adjusted under 35 U.S.C. 154(b) by 62 days.

(21) Appl. No.: 14/766,953

(22) PCT Filed: Jul. 16, 2012

(86) PCT No.: PCT/US2012/046975
§ 371 (c)(1),
(2), (4) Date: Jan. 13, 2016

(87) PCT Pub. No.: WO2014/014446
PCT Pub. Date: Jan. 23, 2014

(65) Prior Publication Data
US 2016/0126060 A1    May 5, 2016

(51) Int. Cl.
*H01J 37/317* (2006.01)
*H01J 37/304* (2006.01)
*H01J 37/22* (2006.01)
*H01J 37/28* (2006.01)
*H01J 37/30* (2006.01)
*H01J 37/305* (2006.01)

(52) U.S. Cl.
CPC ............ *H01J 37/317* (2013.01); *H01J 37/22* (2013.01); *H01J 37/28* (2013.01); *H01J 37/304* (2013.01); *H01J 37/3005* (2013.01); *H01J 37/3056* (2013.01); *H01J 2237/08* (2013.01); *H01J 2237/24578* (2013.01); *H01J 2237/2814* (2013.01); *H01J 2237/30466* (2013.01); *H01J 2237/31745* (2013.01); *H01J 2237/31749* (2013.01)

(58) Field of Classification Search
CPC ... H01J 2237/31749; H01J 2237/24578; H01J 2237/30466; H01J 2237/31745; H01J 2237/08; H01J 2237/2814; H01J 37/317; H01J 37/3005; H01J 37/304; H01J 37/3056; H01J 37/22; H01J 37/28
See application file for complete search history.

(56) References Cited

U.S. PATENT DOCUMENTS

| 5,434,409 A | 7/1995 | Tsubusaki |
| 5,435,850 A | 7/1995 | Rasmussen |
| 5,851,413 A | 12/1998 | Casella et al. |

(Continued)

FOREIGN PATENT DOCUMENTS

| CN | 101361157 A | 2/2009 |
| CN | 102207472 B | 10/2011 |

(Continued)

*Primary Examiner* — Nicole Ippolito
*Assistant Examiner* — Sean Luck
(74) *Attorney, Agent, or Firm* — Scheinberg & Associates, P.C.; Michael O. Scheinberg (57) ABSTRACT

To expose a desired feature, focused ion beam milling of thin slices from a cross section alternate with forming a scanning electron image of each newly exposed cross section. Milling is stopped when automatic analysis of an electron beam image of the newly exposed cross section shows that a pre-determined criterion is met.

18 Claims, 6 Drawing Sheets

(56) References Cited

U.S. PATENT DOCUMENTS

| | | | |
|---|---|---|---|
| 6,332,962 B1* | 12/2001 | Athas | G11B 5/1871 |
| | | | 204/192.34 |
| 6,649,919 B2* | 11/2003 | Chao | H01J 37/3005 |
| | | | 250/309 |
| 6,889,113 B2* | 5/2005 | Tasker | H01J 37/28 |
| | | | 700/166 |
| 7,129,484 B2* | 10/2006 | Hwu | G01N 23/04 |
| | | | 250/307 |
| 7,321,118 B2 | 1/2008 | Ward | |
| 7,368,727 B2 | 5/2008 | Ward | |
| 7,414,243 B2 | 8/2008 | Ward | |
| 7,485,873 B2 | 2/2009 | Ward et al. | |
| 7,488,952 B2 | 2/2009 | Ward et al. | |
| 7,495,232 B2 | 2/2009 | Ward et al. | |
| 7,504,639 B2 | 3/2009 | Ward et al. | |
| 7,511,279 B2 | 3/2009 | Ward et al. | |
| 7,511,280 B2 | 3/2009 | Ward et al. | |
| 7,518,122 B2 | 4/2009 | Ward et al. | |
| 7,521,693 B2 | 4/2009 | Ward et al. | |
| 7,554,096 B2 | 6/2009 | Ward et al. | |
| 7,554,097 B2 | 6/2009 | Ward et al. | |
| 7,557,358 B2 | 7/2009 | Ward et al. | |
| 7,557,359 B2 | 7/2009 | Ward et al. | |
| 7,557,360 B2 | 7/2009 | Ward et al. | |
| 7,557,361 B2 | 7/2009 | Ward et al. | |
| 7,601,953 B2 | 10/2009 | Ward et al. | |
| 7,732,765 B2 | 6/2010 | Yamaguchi et al. | |
| 7,786,451 B2 | 8/2010 | Ward et al. | |
| 7,786,452 B2 | 8/2010 | Ward et al. | |
| 7,804,068 B2 | 9/2010 | Notte, IV | |
| 7,879,730 B2 | 2/2011 | Naser-Ghodsi et al. | |
| 8,095,231 B2 | 1/2012 | Tasker et al. | |
| 8,110,814 B2 | 2/2012 | Ward et al. | |
| 8,134,124 B2 | 3/2012 | Blackwood et al. | |
| 8,170,832 B2 | 5/2012 | Young et al. | |
| 2003/0127424 A1* | 7/2003 | Clinton | B82Y 25/00 |
| | | | 216/22 |
| 2005/0173631 A1 | 8/2005 | Ray et al. | |
| 2006/0219953 A1* | 10/2006 | Carleson | G01N 23/2251 |
| | | | 250/492.21 |
| 2007/0018099 A1* | 1/2007 | Chitturi | G01B 15/08 |
| | | | 250/310 |
| 2008/0009140 A1* | 1/2008 | Williamson | G01R 31/2898 |
| | | | 438/706 |
| 2008/0073580 A1* | 3/2008 | Phaneuf | H01J 37/3005 |
| | | | 250/492.21 |
| 2009/0242759 A1* | 10/2009 | Bray | G01R 31/307 |
| | | | 250/307 |
| 2010/0116977 A1* | 5/2010 | Young | G01N 1/286 |
| | | | 250/252.1 |
| 2010/0243889 A1 | 9/2010 | Faber et al. | |
| 2010/0300873 A1* | 12/2010 | Blackwood | G01N 1/32 |
| | | | 204/192.33 |
| 2010/0301211 A1* | 12/2010 | Miller | H01J 37/09 |
| | | | 250/307 |
| 2011/0049362 A1 | 3/2011 | Matsumoto et al. | |
| 2011/0084207 A1* | 4/2011 | Zhang | H01J 37/3005 |
| | | | 250/307 |
| 2011/0240852 A1 | 10/2011 | Tanner | |
| 2011/0297826 A1 | 12/2011 | Madokoro et al. | |
| 2012/0112063 A1 | 5/2012 | Schertel | |
| 2012/0187285 A1 | 6/2012 | Young et al. | |
| 2013/0319849 A1 | 12/2013 | Fuller et al. | |
| 2015/0136977 A1 | 5/2015 | Buxbaum | |
| 2015/0323429 A1 | 11/2015 | Blackwood et al. | |

FOREIGN PATENT DOCUMENTS

| | | |
|---|---|---|
| CN | 102272878 B | 12/2011 |
| EP | 2418674 A2 | 2/2012 |
| JP | H04062748 | 2/1992 |
| JP | H06160067 A | 6/1994 |
| JP | H11273613 A | 10/1999 |
| JP | 2005317330 A | 11/2005 |
| JP | 2010507782 A | 3/2010 |
| TW | 200942800 A | 10/2009 |
| WO | 2010051546 | 5/2010 |

* cited by examiner

```
Branching
 (•) Automated    ( ) Manual    ( ) None
When Automated is selected, you can specify a formula that may be evaluated
before or after the chapter's execution and determines the next action to be
taken. You may specify the next action from a list of True or False actions listed.
```

```
Enter a formula to set constraints on the chapter.
e.g.      IF([Pages=[Page-1]]Sheet.3!User.GizmoRunStatus = True, True,False)
                                                                    Value
[✓] Formula  [if(ABS(pages=[TS-check target]]sheet2!0!endy) < K, true,]  [ ]
Evaluate formula ( ) before or (•) after the chapter runs.           — 604
True  [Chapter.2      ▼]        False  [Chapter.3      ▼]
```

```
Max Iterations  [7]                  [ ] Loop Until Stopped

Note: Max Iterations is the maximum number of times a chapter can run on a site in
automated mode. The value must be between 1 and 2^31 (2,147,483,647)
```

```
A chapter exception occurs when it exceeds the maximum number of iterations.
Action to perform on exception    [Abort Site          ▼]
Note: Task exception overrides are not applicable to the chapter exception
actions.
```

FIG. 6

ENDPOINTING FOR FOCUSED ION BEAM PROCESSING

TECHNICAL FIELD OF THE INVENTION

The present invention relates to charged particle processing and in particular to a technique for automating a charged particle beam process.

BACKGROUND OF THE INVENTION

As nanotechnology produces smaller and smaller circuits and other elements, it becomes more difficult to produce and manipulate the nanometer scale objects. While it is known that it is desirable to automate nano-processes, the precise nature of those processes makes automation difficult, if not impossible for many processes.

The line widths of features achievable in semiconductor processing are significantly less than 100 nm. To control critical processes during fabrication, it is necessary to observe and measure the results of those processes. Scanning electron microscopes (SEM) are used to observe microscopic features, but as the feature size of fabricated structures decreases, the resolution of SEM is insufficient, and it is necessary to observe defects on a transmission electron microscope (TEM). While a SEM can observe a feature on a thick work piece, to observe a sample on a TEM, it needs to be thinned to less than 100 nm so that electrons will travel through the sample. It can be exceedingly difficult to thin a sample to less than 100 nm while ensuring that the feature that requires observation remains in the sample and is not milled away in the thinning process.

An operator will typically observe the sample as it is being thinned, stopping regularly to observe the sample to see whether or not the feature is exposed for observation. When the feature to be observed is exposed on the surface, then thinning is stopped. This can be very time consuming and labor intensive. Moreover, the results are inconsistent from operator to operator because the decision of when to stop is subjective.

U.S. Pat. Pub. 2010243889 of Farber et al. describes a method of endpointing when forming a lamella for viewing on a transmission electron microscope. In accordance with Farber, secondary particles are collected as the ion beam thins the lamella, and the image formed from the secondary particles is used to form a rough image of the cross section. The image is rough because the ion beam impacts the lamella at a glancing angle, and because the secondary particles from deep in the trench are not detected as well as the secondary particles from higher up in the trench.

SUMMARY OF THE INVENTION

An object of the invention is to facilitate automation of charged particle beam, nanoscale processes.

To expose a surface showing features meeting a predefined criterion in focused ion beam (FIB) milling, a thin portion of the sample is milled and an electron beam image of the exposed surface is analyzed. If the exposed features do not meet the criterion, another slice is milled from the surface and the newly exposed surface analyzed to determine whether or not the exposed features meet the criterion. The process is repeated until the desired face is exposed or a predetermined number of slices have been performed.

The predefined criterion may be defined by a geometrical relationship between exposed features, such as a distance between lines, an angle, or a relationship between lines or angles. In some embodiments, the image is automatically analyzed to identify edges in the image. The edges define a feature that is measured to determine whether the milling is complete.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

In accordance with a preferred embodiment of the invention, a system determines when to stop milling by determining whether a criteria is met, the criteria being based on a measurement from an edge determined by edge recognition software.

Applicants have found that in some applications, conventional image recognition software is inadequate for endpointing of FIB milling Conventional image recognition scores a current image relative to a stored reference image with regard to two primary conditions: image uniqueness and contrast. The best scoring reference image is chosen as the "recognized" image, and acted upon.

A preferred embodiment uses image recognition software for gross determination of the endpoint, and then uses a dimension determined using edge recognition for fine endpointing. Edge recognition is simpler than image recognition and looks at the contrast of the pixels in an image and determines an edge by a change in contrast. A smoothing function is typically applied to produce a smooth curve corresponding to the edge. After edges are recognized, geometric relationships between the edges, such as distances or angles, can be determined and used to evaluate the image to determine when to stop milling. The process provides a closed loop feedback, in which after, one or more fine mill steps, the dimension is checked to determine whether or not to cease milling In some applications, the invention is used to determine when to stop thinning a lamella being prepared for viewing on a transmission electron microscope. A process for forming a lamella is described, for example, in U.S. Prov. Pat. App. No. 61/649,917, filed May 21, 2012, for "Preparation of Lamellae for TEM Viewing"which is assigned to the assignee of the present invention and is hereby incorporated by reference. In the prior art process described in U.S. Prov. Pat. App. No. 61/649,917, thinning is performed by the ion beam, using either a fiducial or an edge of the lamella itself as a reference to determine the placement of the beam for the final cut. This beam placement is not sufficiently accurate in some cases to stop the milling at the desired location, which may be determined by the exposure of a feature in the face of the cross section, rather than by a thickness of the cross section.

Figure 1:
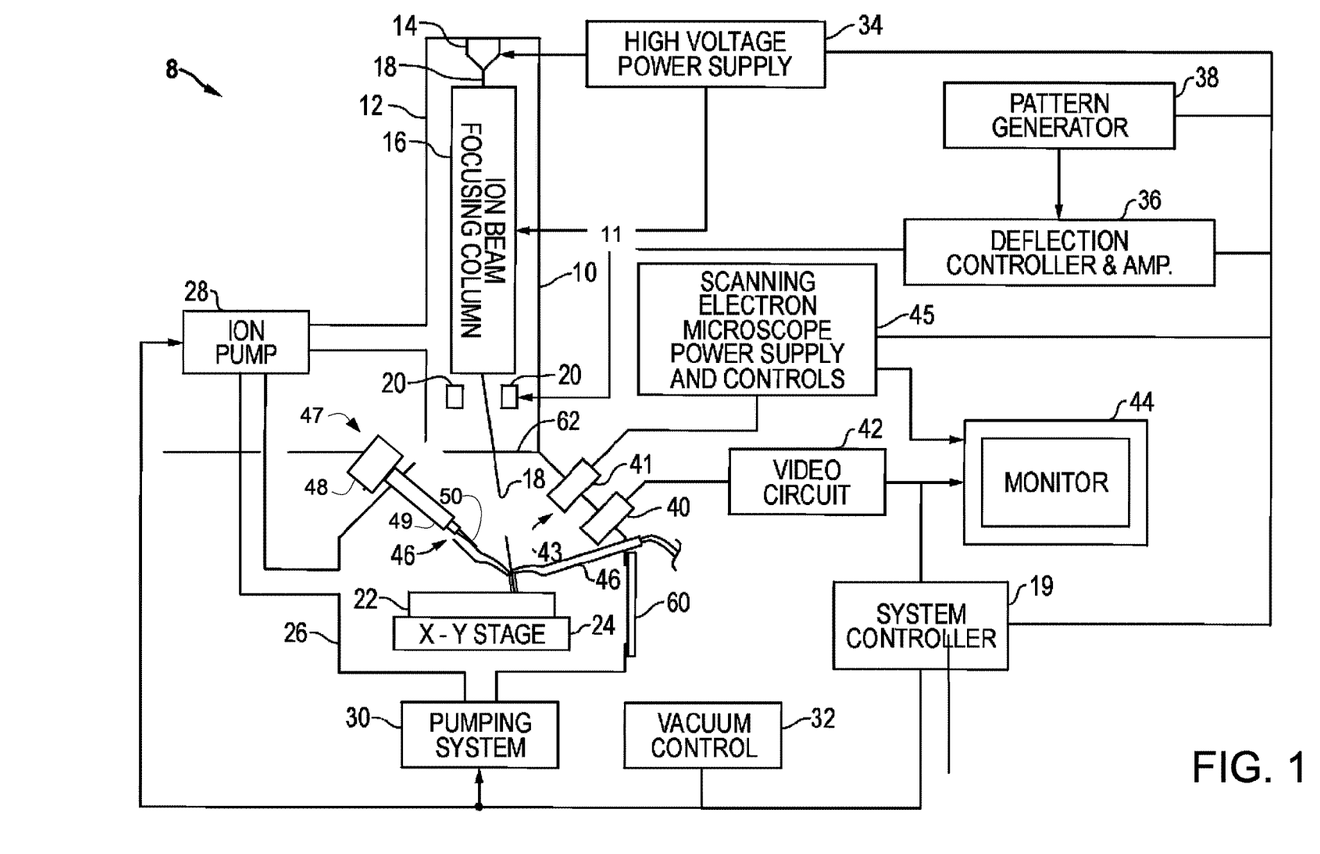
FIG. 1 shows a charged particle beam system that can be used to implement the invention.

FIG. 1 shows a typical ion beam system, focused ion beam (FIB) system 10, suitable for practicing the present invention. FIB system 10 includes an evacuated envelope 11 having an upper neck portion 12 within which are located a liquid metal ion source 14 and a focusing column 16 including extractor electrodes and an electrostatic optical system. Other types of ion sources, such as multicusp or other plasma sources, and other optical columns, such as shaped beam columns, could also be used, as well as electron beam and laser system.

An ion beam 18 passes from liquid metal ion source 14 through ion beam focusing column 16 and between electrostatic deflection plates means schematically indicated at deflection plates 20 toward sample 22, which comprises, for example, a semiconductor device positioned on movable X-Y stage 24 within lower chamber 26. A system controller 19 controls the operations of the various parts of FIB system 10. Through system controller 19, a user can control ion beam 18 to be scanned in a desired manner through commands entered into a conventional user interface (not shown). Alternatively, system controller 19 may control FIB system 10 in accordance with programmed instructions.

For example, a user can delineate a region of interest on a display screen using a pointing device, and then the system could automatically perform the steps described below to extract a sample. In some embodiments, FIB system 10 incorporates image recognition software, such as software commercially available from Cognex Corporation, Natick, Mass., to automatically identify regions of interest, and then the system can manually or automatically extract samples in accordance with the invention. For example, the system could automatically locate similar features on semiconductor wafers including multiple devices, and take samples of those features on different (or the same) devices.

An ion pump 28 is employed for evacuating upper neck portion 12. The lower chamber 26 is evacuated with turbomolecular and mechanical pumping system 30 under the control of vacuum controller 32. The vacuum system provides within lower chamber 26 a vacuum of between approximately $1\times10^{-7}$ Torr ($1.3\times10^{-7}$ mbar) and $5\times10^{-4}$ Torr ($6.7\times10^{-4}$ mbar). If an etch-assisting gas, an etch-retarding gas, or a deposition precursor gas is used, the chamber background pressure may rise, typically to about $1\times10^{-5}$ Torr ($1.3\times10^{-5}$ mbar).

High voltage power supply 34 is connected to liquid metal ion source 14 as well as to appropriate electrodes in ion beam focusing column 16 for forming an approximately 1 KeV to 60 KeV ion beam 18 and directing the same toward a sample. Deflection controller and amplifier 36, operated in accordance with a prescribed pattern provided by pattern generator 38, is coupled to deflection plates 20 whereby ion beam 18 may be controlled manually or automatically to trace out a corresponding pattern on the upper surface of sample 22. In some systems the deflection plates are placed before the final lens, as is well known in the art. Beam blanking electrodes (not shown) within ion beam focusing column 16 cause ion beam 18 to impact onto blanking aperture (not shown) instead of target 22 when a blanking controller (not shown) applies a blanking voltage to the blanking electrode.

The liquid metal ion source 14 typically provides a metal ion beam of gallium. The source typically is capable of being focused into a sub one-tenth micrometer wide beam at sample 22 for either modifying the sample 22 by ion milling, enhanced etch, material deposition, or for the purpose of imaging the sample 22. A charged particle detector 40, such as an Everhart Thornley detector, a continuous dynode electron multiplier detector, a multi-channel plate detector, or a solid state detector is used for detecting secondary ion or electron emission is connected to a video circuit 42 that supplies drive signals to video monitor 44 and receiving deflection signals from system controller 19. In some embodiments, secondary electrons are attracted from the sample back up through the primary electron lens, and then deflected off the optical axis for detection.

The location of charged particle detector 40 within lower chamber 26 can vary in different embodiments. For example, a charged particle detector 40 can be coaxial with the ion beam and include a hole for allowing the ion beam to pass. In other embodiments, secondary particles can be collected through a final lens and then diverted off axis for collection. A scanning electron microscope 41, along with its power supply and controls 45, are optionally provided with the FIB system 10.

A gas delivery system 46 extends into lower chamber 26 for introducing and directing a gaseous vapor toward sample 22. U.S. Pat. No. 5,851,413 to Casella et al. for "Gas Delivery Systems for Particle Beam Processing," assigned to the assignee of the present invention, describes a suitable gas delivery system 46. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A micromanipulator 47, such as the AutoProbe 200™ from Omniprobe, Inc., Dallas Tex., or the Model MM3A from Kleindiek Nanotechnik, Reutlingen, Germany, can precisely move objects within the vacuum chamber. Micromanipulator 47 may comprise precision electric motors 48 positioned outside the vacuum chamber to provide X, Y, Z, and theta control of a portion 49 positioned within the vacuum chamber. The micromanipulator 47 can be fitted with different end effectors for manipulating small objects. In the embodiments described below, the end effector is a thin probe 50 having a tapered end. The thin probe 50 may be electrically connected to system controller 19 to apply an electric charge to the probe 50 to control the attraction between a sample and the probe.

A door 60 is opened for inserting sample 22 onto X-Y stage 24, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam focusing column 16 for energizing and focusing ion beam 18. When it strikes sample 22, material is sputtered, that is physically ejected, from the sample. Alternatively, ion beam 18 can decompose a precursor gas to deposit a material. Focused ion beam systems are commercially available, for example, from FEI Company, Hillsboro, Oreg., the assignee of the present application. While an example of suitable hardware is provided above, the invention is not limited to being implemented in any particular type of hardware.

Figure 2:
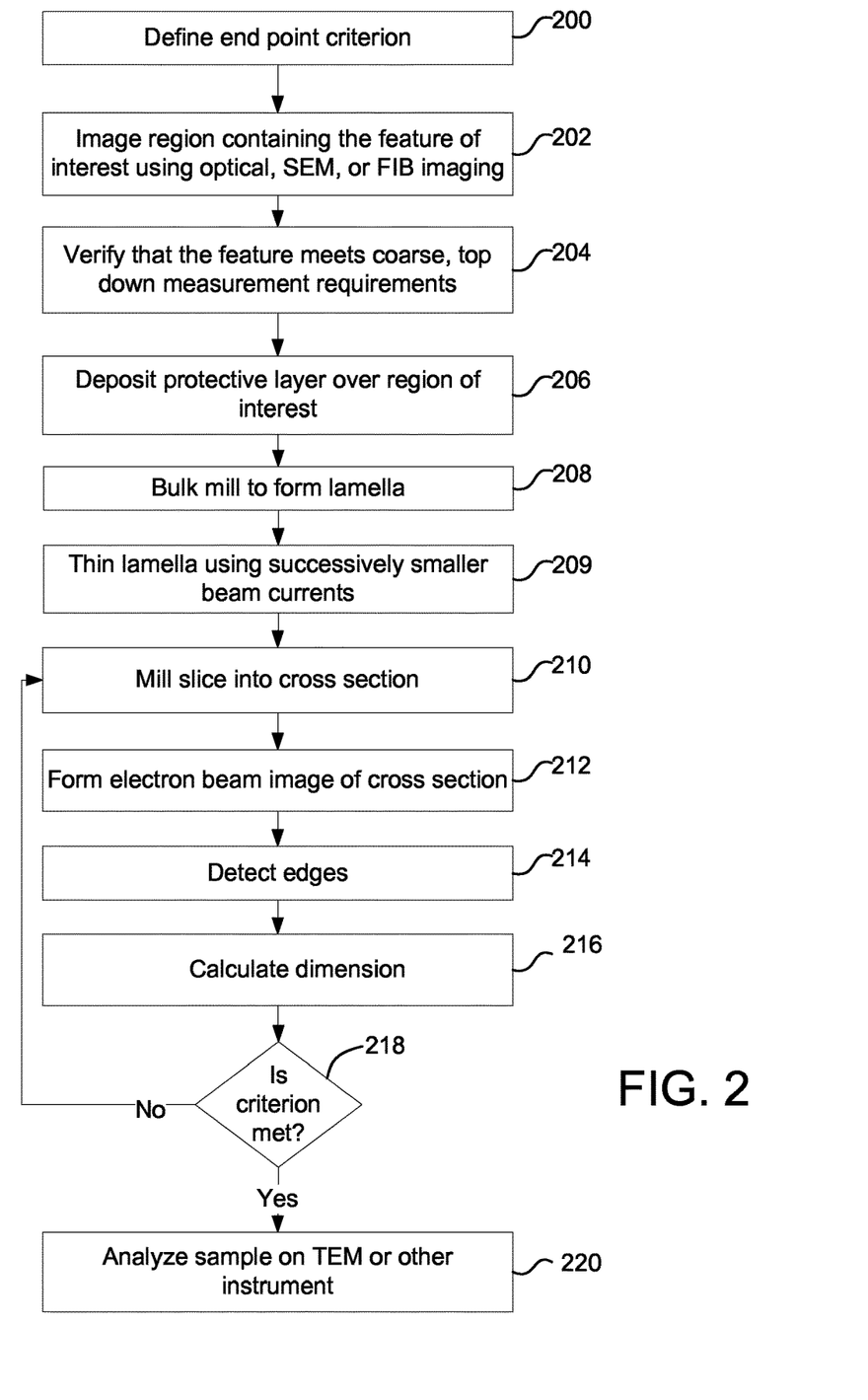
FIG. 2 show is a flow chart showing the steps of an embodiment of the invention.
Figure 3A:
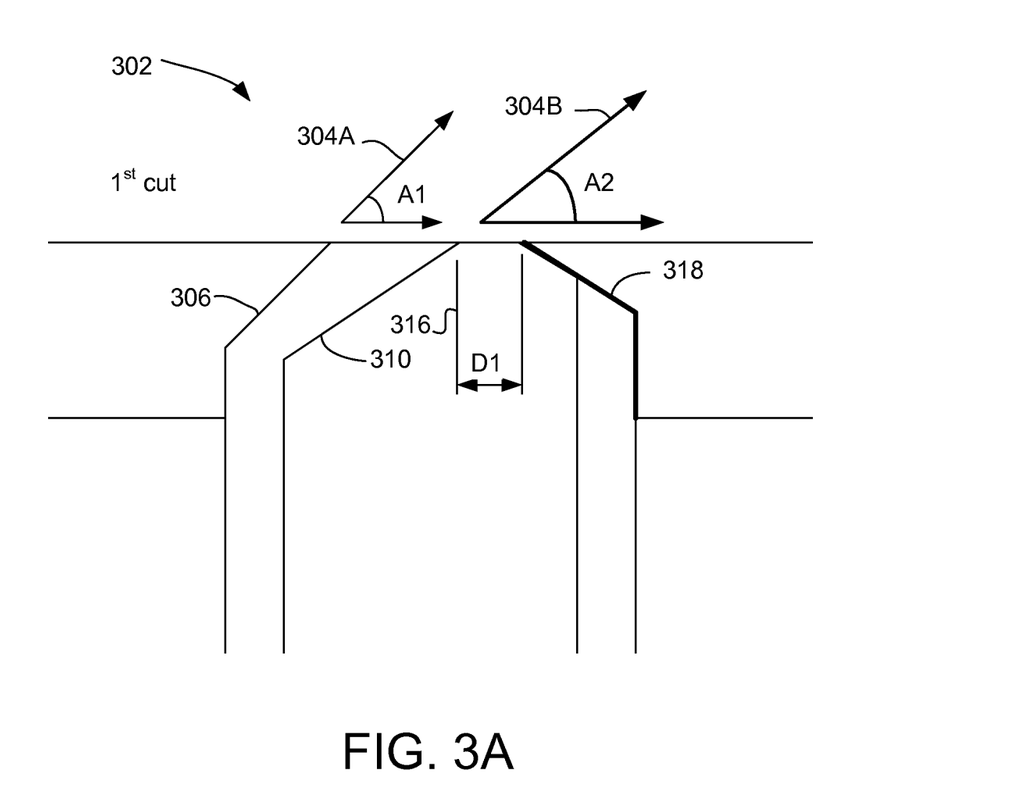
FIG. 3A shows a cross sectioned writer pole being prepared in accordance with the embodiment of FIG. 2.

FIG. 2 is a flow chart of an example of the invention, in which a lamella is automatically thinned until a predetermined condition is met. In step 200, the user defines a criterion for ending milling based on what the user is trying to observe. For example, the milling may be ended when a particular dimension is maximized or when an edge makes a predetermined angle. The user can designate the edges to be detected and the dimensions to be measured using a system such as that described in U.S. Pat. No. 8,095,231 to Tasker et al., for a "Graphical automated machine control and metrology," which is assigned to the assignee of the present invention and which is hereby incorporated by reference. Tasker describes a graphical programming system that allows a user to place geometric shapes onto a scaled image, the shape having associated behavior that operates on the image or on the object of which the image is formed. The shapes are dragged from a stencil onto an image provided by an ion beam or an electron microscope. The shape invokes software or hardware to locate and measure features on the image or to perform operations, such as ion beam milling, on the object that is imaged. The system is "trained" on an image similar to the image that the user expects to find when the cross sectioning is complete. For example, FIG. 3A shows an expected image of a writer pole 302 for writing to a magnetic medium, such as a hard disk, and angle shapes 304A and 304B that a user has dragged onto the image from a stencil. Angle shapes 304A indicate that the system should detect lines 306 and measure the angle between the line and the top surface. Angle shapes 304B indicate that the system should detect line 310 and measure the angle between the line and the top surface. Dimension shape 316 indicates that the system should measure the length between where lines 310 and 318 intersect the top surface. The magnification of the electron beam or ion beam image is known, and so the dimensions can be calculated by their sizes on the image.

Figure 3B:
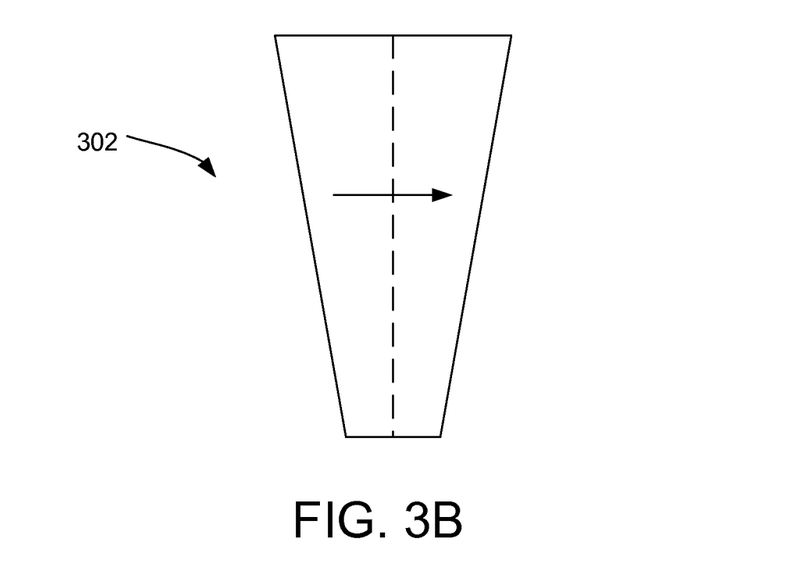
FIG. 3B shows a top down view of a writer pole before cross sectioning or TEM Preparation.
Figure 4A:
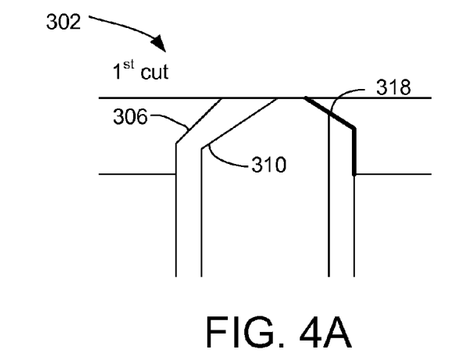
FIGS. 4A-4E shows several iterations of milling the writer pole of FIG. 3 in accordance with embodiment of FIG. 2.
Figure 4B:
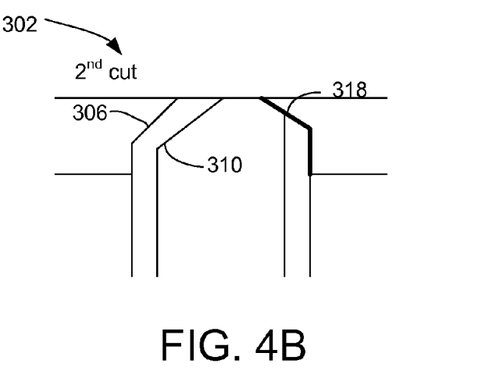
Figure 4C:
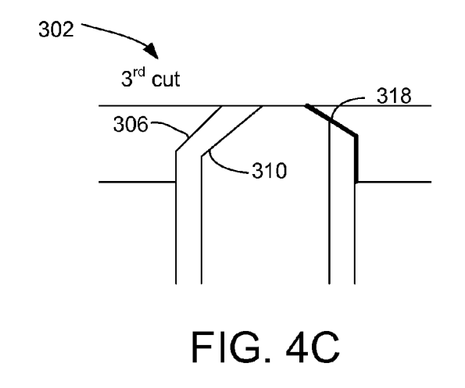
Figure 4D:
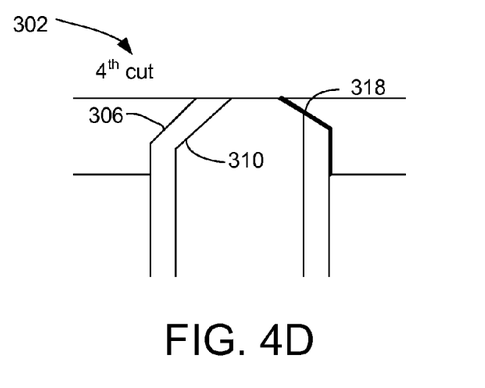
Figure 4E:
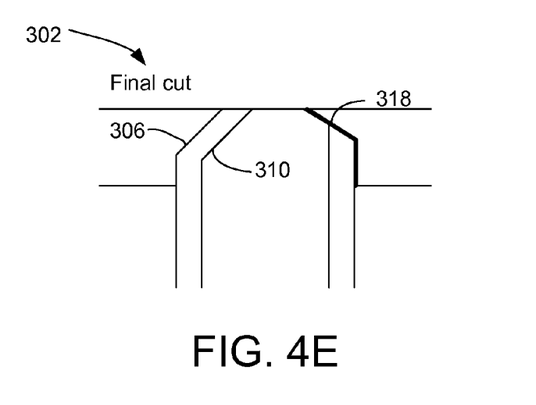

The angle 304B between line 310 and the surface is not constant throughout the writer pole. FIG. 3B shows a top view of the writer pole, with the dotted line indicating the FIB cut slice through the writer pole. When a cross section or lamella face of the writer pole of FIG. 3B is imaged at a 45 degree tilt, the image of FIG. 3A is observed. As the cross section or lamella surface face is advanced through the substrate (perpendicular to dotted line), the angle 304B changes. In one example, the criterion for stopping milling is when angle 304A and 304B are equal in the exposed cross section. FIGS. 4A-4E show the progression of the angle 304B with subsequent slices milled from the cross section. The angle 304B gets progressively closer to the angle 304A, until in the final image of FIG. 4E, lines 310 and 306 are parallel to each other. If that was the specified criteria, then milling is ceased at that point.

FIG. 2, step 202, shows the region containing the feature of interest is located using indicia visible on the surface of the sample by imaging the surface with an optical microscope and/or a scanning electron microscope. In step 204, the user verifies that the feature meets coarse, top down measurement requirements, that is, the feature top down height and width are deemed useful for recipe to continue. In step 206, a protective layer is deposited over the top of the region of interest.

In step 208, a lamella is formed by bulk milling trenches on both sides of the region of interest to leave a region about, for example, 500 nm thick. Pattern recognition and calipers applied to a fiducial, typically without closed loop feedback, are used to accurately place mills The pattern recognition and caliper software are sufficiently accurate to place bulk mills, but are insufficiently accurate to determine cut placement location when performing final thinning After bulk milling is completed, the lamella is made thinner with successively smaller FIB beam currents in step 209. Final thinning, on both sides of lamella, is typically performed using "box mill" as illustrated in step 210. During a "box mill" the ion beam is raster or serpentine scanned left to right to form a line, then advanced forward. After the area (box) is complete, the beam is returned to the start of the pattern (lower left corner) and the mill pattern is repeated. This rescanning of pattern occurs multiple times and is critical to cleaning the face of the lamella and minimizing mill artifacts (eg., redeposition). After milling is complete, an image of the cross section face is formed in step 212 by an electron beam, typically oriented at an angle 45 degrees to the cross section face. In step 214, edge recognition software finds edges in the electron beam image. In step 216, a calculation determines one or more dimensions using the recognized edges.

In decision block 218, the system determines whether or not the dimensions meet the criterion from step 200. If the dimension criterion is not met, milling is continued with step 210. Each subsequent mill removes a small amount of material from the face of the cross section, moving progressively deeper into the sample. In some embodiments, the beam is moved preferably less than 50 nm, more preferably less than 10 nm, more preferably less than 5 nm and even more preferably less than 3 nm or less than 1 nm into the cross section face. The cross section face is imaged with the electron beam after each mill When the dimension criterion is met, milling is stopped. In some embodiments, the thickness of subsequent slices is determined from the image. That is, if the image indicates that the cross section is near the desired point, smaller slices are milled The cross section surface can then be analyzed in more detail in step 220. For example, if the sample was being prepared for viewing on an SEM or TEM, the sample can then be viewed.

Figure 5A:
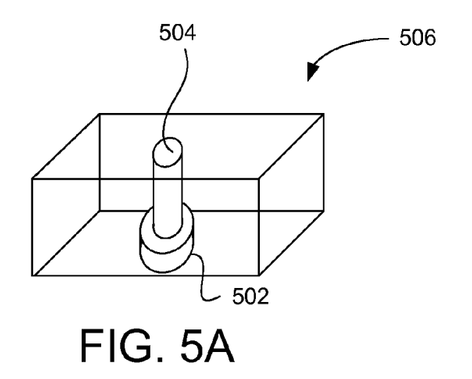
FIG. 5A shows a contact feature and FIGS. 5B to 5E show a sequence of cross sections of the contact feature.
Figure 5B:
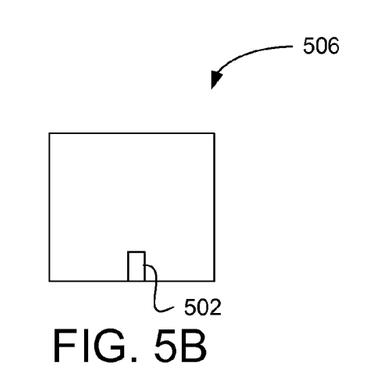
Figure 5C:
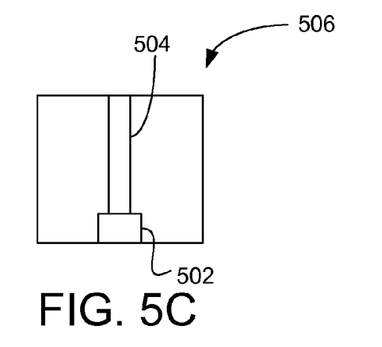
Figure 5D:
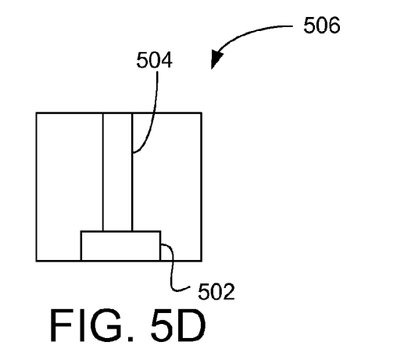
Figure 5E:
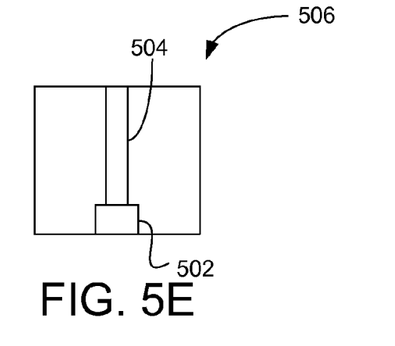
Figure 6:
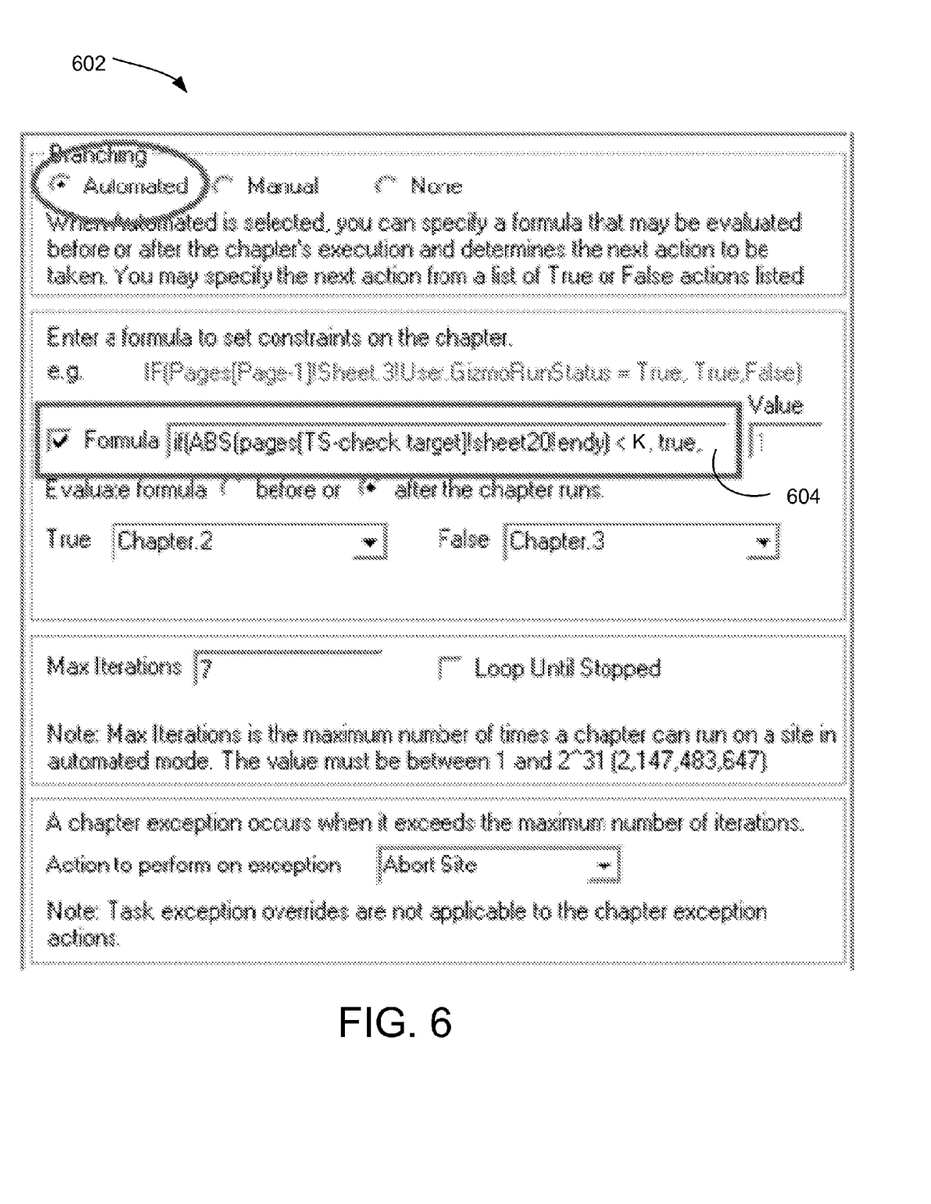
FIG. 6 shows a menu from a system used to implement an embodiment of the invention.

FIGS. 5A-5E shows another example of a use of the invention. FIG. 5A shows a contact feature 502 and conductor 504 in a semiconductor circuit 506. In this example, it is desired to stop milling when the diameter of a contact feature 502 is exposed in the cross section. In FIG. 5B, the cross section face cuts through the circular pad near the edge of the pad, exposing a small portion of the contact feature 502. As subsequent mills cut further into the feature, more of the feature is exposed as shown in FIG. 5C until the cross section is at the center of the feature as shown in FIG. 5D. Subsequent milling will then expose less of the feature. Ideally, milling would be stopped at the depth shown in FIG. 5E. In practice, it is necessary to mill slightly beyond maximum feature exposure to determine when the maximum feature expose was reached. For example, milling can be stopped when the portion of the feature exposed decreases by a few percent in a subsequent mill FIG. 6 shows a menu 602 used on a Dual Beam system to perform milling in accordance with an embodiment of the present invention. The menu shows that "automated" is selected, which means that the user specifies a formula that is evaluated to determine the subsequent operation. The formula is shown in box 604, and the menu indicates that the formula is evaluated after the procedure, that is, after milling with the FIB and imaging with the SEM. The formula in the embodiment of FIG. 3, for example, would determine whether the difference in angles 304A and 304B is less than a specified value. If the formula evaluated to "true," that is, if the angles are nearly equal, the system executes "chapter.2" which corresponds to ceasing milling If the formula evaluated to "false," that is, if the angles are not nearly equal, the system executes "chapter.3" which corresponds to another iteration of milling, imaging, and evaluating the formula. Menu 602 shows that the sequence will stop after 7 iterations, even if the formula still evaluated to "false."

Embodiments of the invention allow a user to cross section a small device without human control. The absence of human control minimizes human error. Some embodiments of the method improve yield and throughput by using closed loop feedback to control FIB milling. Generally, the method also allows the user to control FIB mill cut placement by monitoring critical dimensions (CDs) with a SEM. When desired CDs are obtained the FIB mill is stopped. In addition to using CDs, some embodiments permit FIB control via SEM image pattern recognition to control mill placement. The SEM image can be compared real time to a reference SEM image. When the images match (or meet a specified logic criterion associated with the reference image (eg. contrast and/or number of pixels) as determined by a scoring algorithm, the FIB mill stops; otherwise it continues.

Fabricating a lamella for viewing on a TEM typically takes between 30 minutes and 2 hours. If the ion beam mills too far into the lamella, the feature of interest can be destroyed, which not only wastes the preparation time, it also destroys a sample that may be critically important to solving a line yield fabrication problem.

While the examples above show the invention used for endpointing during TEM sample preparation, the invention is also useful in preparing a cross section for observation in an SEM or other instrument. The term "cross section" is used broadly to include a cross section exposed in a portion of a sample, such as for SEM viewing, or any thin sample such as for TEM viewing, whether a cross section or a planar view sample.

Although the description above describes embodiments related to preparing cross sections/lamellae to observe designed structures for process control, other embodiments are used to prepare cross sections/lemellae of defects for observation. Because the size, shape, and location of the defect is typically not exactly known, endpointing can consist of comparing the SEM image of the cross section/lamella face to a known good cross section/lamella face, and ceasing milling when the image deviates from a reference image or meets a specific pixel/contrast signature.

The term "feature" as used herein can mean not only a structure, but the arrangement of a structure in a cross section.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, matter composition, means, methods and steps described in the specification. As one of ordinary skill in the art will readily appreciate from the disclosure of the present invention, processes, machines, manufacture, matter composition, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, matter composition, means, methods, or steps.

We claim as follows:

1. A method of automatically processing a work piece with a charged particle beam, comprising:
   defining a criterion that specifies when milling is complete and exposes a desired target feature cross section at a desired location within the work piece, independently of the thickness of the work piece, wherein the target feature is a circuit element inside the work piece;
   directing an ion beam toward the work piece to remove a portion of material from the work piece by ion beam milling to expose a target feature cross section;
   next, directing an electron beam toward the target feature cross section along a face of the work piece exposed by the milling in the previous step to form an electron beam image of the target feature cross section;
   automatically evaluating the electron beam image by conducting measurements of one or more exposed features within the target feature cross section to determine if the criterion is met by determining when an angle between two exposed edges of the circuit element in the electron beam image is at a first angle indicating the target feature is exposed but not yet exposed at the desired cross section, and later determining when the angle is at a second angle indicating the desired target feature cross section is exposed; and
   if the criterion is not met, repeatedly directing the ion beam to remove a further portion of material from the work piece to expose a fresh target feature cross section and re-evaluating the criterion until the criterion is met.

2. The method of claim 1 in which automatically evaluating the electron beam image includes determining a dimension defined by exposed features in the image.

3. The method of claim 1 in which automatically evaluating the electron beam image includes determining a dimension defined by exposed features in the image includes determining when a distance between two features is equal to a specified value.

4. The method of claim 1 in which automatically evaluating the electron beam image includes automatically finding edges in the electron beam image and determining a dimensional relationship between the edges.

5. The method of claim 2 in which automatically finding edges comprises using changes in contrast between pixels in an image.

6. The method of claim 5 in which automatically finding edges comprises applying a smoothing algorithm to improve edge detection.

7. The method of claim 1 in which defining a criterion that specifies when milling is complete includes determining when a maximum feature exposure has been reached.

8. The method of claim 1 in which defining a criterion that specifies when milling is complete includes specifying an angle between two exposed features.

9. The method of claim 1 in which repeatedly directing the ion beam to expose a target feature fresh cross section includes directing the ion beam to remove less than 10 nm of material from the target feature cross section in at least one of the repetitions.

10. The method of claim 9 in which repeatedly directing the ion beam to expose a fresh target feature cross section includes directing the ion beam to remove less than 5 nm of material from the target feature cross section in at least one of the repetitions.

11. The method of claim 1 in which automatically evaluating the electron beam image includes comparing the electron beam image to one or more reference images.

12. The method of claim 1 in which directing an ion beam to expose a target feature cross section comprises directing an ion beam to expose a target feature cross section including a structural feature.

13. The method of claim 1 in which directing an ion beam to expose a target feature cross section comprises directing an ion beam to expose a target feature cross section including a defect.

14. The method of claim 1 in which directing an ion beam toward the work piece to expose a target feature cross section comprises directing an ion beam to thin one side of a lamella having a thickness of less than 100 nm for TEM viewing.

15. The method of claim 1 in which directing an ion beam toward the work piece to expose a target feature cross section comprises directing an ion beam to form a vertical wall in a work piece and in which directing an electron beam toward the target feature cross section includes forming a SEM image of the vertical wall.

16. A charged particle beam system, comprising:
a work piece vacuum chamber for containing a work piece;
an ion beam column for producing an ion beam and directing it to the work piece;
an electron beam column for producing an electron beam and directing it to the work piece; a secondary particle detector for detecting secondary particles and forming an image of a portion of the work piece;
a processor for a carrying out computer instructions; and
a computer memory including computer instructions for performing the following:
defining a criterion that specifies when milling is complete and exposes a desired target feature cross section at a desired location within a target region, independently of the thickness of the work piece, wherein the target feature is a circuit element inside the work piece;
directing the ion beam toward the work piece to remove a portion of material from the work piece by ion beam milling to expose a target feature cross section;
next, directing the electron beam toward the target feature cross section along a face of the work piece exposed by the milling in the previous step to form an electron beam image of the target feature cross section;
automatically evaluating the electron beam image by conducting measurements of one or more exposed features within the target feature cross section to determine if the criterion is met by determining when an angle between exposed edges of the circuit element in the electron beam image is at a first angle indicating the target feature is exposed but not yet exposed at the desired cross section, and later determining when the angle is at a second angle indicating the desired target feature cross section is exposed; and;
if the criterion is not met, repeatedly directing the ion beam to remove a further portion of material from the work piece to expose a fresh target feature cross section and re-evaluating the criterion until the criterion is met.

17. The charged particle beam system of claim 16, in which automatically evaluating the electron beam image includes determining a dimension defined by exposed features in the image.

18. The charged particle beam system of claim 16, in which automatically evaluating the electron beam image includes automatically finding edges in the electron beam image and determining a dimensional relationship between the edges.

* * * * *